(12) United States Patent
Goupil et al.

(10) Patent No.: US 10,886,646 B2
(45) Date of Patent: Jan. 5, 2021

(54) HIGH SPEED HOT SHOE

(71) Applicant: Wilcox Industries Corp., Newington, NH (US)

(72) Inventors: Dominic R. Goupil, Kittery, ME (US); Ned A. Dalzell, Portsmouth, NH (US)

(73) Assignee: Wilcox Industries Corp., Newington, NH (US)

( * ) Notice: Subject to any disclaimer, the term of this patent is extended or adjusted under 35 U.S.C. 154(b) by 25 days.

(21) Appl. No.: 16/441,608

(22) Filed: Jun. 14, 2019

(65) Prior Publication Data

US 2019/0386412 A1 Dec. 19, 2019

Related U.S. Application Data (60) Provisional application No. 62/685,180, filed on Jun. 14, 2018.

(51) Int. Cl.
*H01R 12/70* (2011.01)
*H01R 12/71* (2011.01)
(Continued)

(52) U.S. Cl.
CPC ....... *H01R 12/7082* (2013.01); *H01R 12/714* (2013.01); *H01R 33/765* (2013.01);
(Continued)

(58) Field of Classification Search
CPC ............. H01R 12/7082; H01R 12/714; H01R 33/765; H01R 33/94; H01R 13/2471;
(Continued)

(56) References Cited

U.S. PATENT DOCUMENTS

| 4,666,276 A * | 5/1987 | Chan ...................... G03B 15/03 |
| | | 362/3 |
| 7,726,994 B1 * | 6/2010 | Willey .................. H01R 13/623 |
| | | 439/218 |

(Continued)

OTHER PUBLICATIONS

Wiki: "30-pin Connector—The iPhone Wiki", Oct. 6, 2016 (Oct. 6, 2016, XP055633555, Retrieved from the Internet: URL:https://web.archive.org/web/20161006150846/https://www.theiphonewiki.com/wiki/30-pin_Connector [retrieved on Oct. 17, 2019].

(Continued)

*Primary Examiner* — Briggitte R. Hammond
(74) *Attorney, Agent, or Firm* — McLane Middleton, Professional Association (57) ABSTRACT

A hot shoe interface system for transmitting high speed data includes a hot shoe portion including a first set of electrical contacts configured to receive high speed data from a first device. A second set of electrical contacts is configured to receive a power signal and a third set of electrical contacts is configured to receive low speed data from the first device. A first set of optical terminals is configured to receive optical data from the first device. A hot shoe receiver further includes a fourth set of electrical contacts configured to provide the high speed data to a second device. A fifth set of electrical contacts is configured to receive the power signal and a sixth set of electrical contacts is configured to provide the high speed data to the second device. A second set of optical terminals is configured to transmit optical data to the second device.

20 Claims, 5 Drawing Sheets

(51) Int. Cl.

| | |
|---|---|
| *H01R 33/76* | (2006.01) |
| *H01R 33/94* | (2006.01) |
| *H05K 1/02* | (2006.01) |
| *H01R 13/24* | (2006.01) |
| *H01R 13/6463* | (2011.01) |
| *H01R 107/00* | (2006.01) |
| *H04B 10/25* | (2013.01) |

(52) U.S. Cl.
CPC .......... *H01R 33/94* (2013.01); *H05K 1/0274* (2013.01); *H01R 13/2471* (2013.01); *H01R 13/6463* (2013.01); *H01R 2107/00* (2013.01); *H04B 10/25891* (2020.05)

(58) Field of Classification Search
CPC ............ H01R 13/6463; H01R 2107/00; H05K 1/0274; H04B 10/2589
See application file for complete search history.

(56) References Cited

U.S. PATENT DOCUMENTS

| 7,783,188 B2* | 8/2010 | Clark .................. G03B 15/05 |
| | | 396/198 |
| 9,031,400 B2* | 5/2015 | Bae .................... G03B 17/02 |
| | | 396/198 |
| 9,203,063 B2* | 12/2015 | Celona ............... H01M 2/1022 |
| 2006/0128226 A1* | 6/2006 | Segawa ............. H01R 13/2442 |
| | | 439/660 |
| 2012/0148195 A1 | 6/2012 | Umeno |
| 2013/0086722 A1 | 4/2013 | Teetzel et al. |
| 2014/0213074 A1 | 7/2014 | Tsang et al. |
| 2015/0201723 A1 | 7/2015 | Rayner et al. |
| 2017/0122706 A1* | 5/2017 | Masarik .............. G02B 6/4206 |
| 2018/0019552 A1* | 1/2018 | Kasugai .............. G03B 17/566 |

OTHER PUBLICATIONS

Sony: "Sony Active Interface Shoe", Apr. 30, 2017 (Apr. 30, 2017), XP055633456, Retrieved from the Internet: URL: https://www.theiphonewiki.com/wiki/30-pin_Connector [retrieved on Oct. 17, 2019].

European Search Report and Written Opinion received in EP19180370.9 dated Nov. 6, 2019.

* cited by examiner

HIGH SPEED HOT SHOE

CROSS-REFERENCE TO RELATED APPLICATION

This application claims the priority benefit of U.S. provisional application No. 62/685,180 filed Jun. 14, 2018. The aforementioned application is incorporated herein by reference in its entirety.

INCORPORATION BY REFERENCE

This application is related to U.S. provisional application Ser. No. 62/825,480 filed Mar. 28, 2019 (ADN. 111602_2). The aforementioned application is incorporated herein by reference in its entirety.

BACKGROUND

The present invention relates generally to a hot shoe interface capable of transmitting high speed data.

Existing data communication interfaces use external connectors that are polarized and include cables that must be physically mated or de-mated. In order to transmit video, for example, with a smart phone, a connector must be used, such as an external cable or docking station. Hot shoe interfaces are known in the art and are advantageous where ease of connection and disconnection, for example, one-handed connection and disconnection, is desired. However, existing hot shoes typically provide limited electrical coupling between devices, often limited to carrying power.

The present disclosure contemplates a hot shoe interface capable of serving as a communication port that may be mated and de-mated without the use of an external cable connector or a plug and socket type of connector, and without degradation of the data signal. In a more limited aspect, the hot shoe has a generally planar surface with terminal contacts such as contact pads configured to communicate with aligned contacts such as contact pins on a mounting assembly or accessory device. The contact points are capable of transmitting high speed data including video and augmented reality data across the hot shoe interface. In certain embodiments, the contact pins comprise gold plated brass pins. In certain more limited aspects, the high speed hot shoe is configured for use with a helmet mount assembly. In certain embodiments, the helmet mount assembly combines fiber optic cables and high speed cables to transmit data and power at high speeds.

SUMMARY

A hot shoe interface system for transmitting high speed data includes a hot shoe portion that further includes a first set of one or more electrical contacts configured to receive high speed data from a first device attached to the hot shoe portion, a second set of one or more electrical contacts configured to receive a power signal, a third set of one or more electrical contacts configured to receive low speed data from the first device, and a first set of optical terminals configured to receive optical data from the first device, and a hot shoe receiver that further includes a fourth set of one or more electrical contacts configured to provide the high speed data to a second device attached to the hot shoe receiver, a fifth set of one or more electrical contacts configured to receive the power signal, a sixth set of one or more electrical contacts configured to provide the high speed data to the second device, and a second set of optical terminals configured to transmit optical data to the second device.

In certain embodiments, the hot shoe portion is disposed on a helmet.

In certain embodiments, the hot shoe receiving portion is disposed on a helmet mount assembly.

In certain embodiments, the first set of one or more electrical contacts are contact pads.

In certain embodiments, the hot shoe portion further comprises a seventh set of one or more electrical contacts configured to receive a radio frequency signal for the first device.

In certain embodiments, the radio frequency signal is an analog or digital video signal.

In certain embodiments, the hot shoe receiving portion further comprises an eighth set of one or more electrical contacts configured to transmit the radio frequency signal to the second device.

In certain embodiments, the first set of one or more electrical contacts is electrically coupled to one or more twisted pairs of conductors.

In certain embodiments, the first set of one or more electrical contacts are disposed in a pair arrangement that facilitates a desired data transfer impedance.

In certain embodiments, the first set of one or more electrical contacts are hardwired to a circuit substrate.

In certain embodiments, the circuit substrate includes a plurality of conductive traces that are of equal length and equal width.

In certain embodiments, the hot shoe portion has a substantially planar surface.

In certain embodiments, the hot shoe portion further comprises a front lip having a first inclined surface and a rear lip having a second inclined surface.

In certain embodiments, the hot shoe receiver portion comprises a front catch portion configured to removably engage with the front lip and a rear catch portion configured to removably engage with the rear lip.

In certain embodiments, the high speed data has a transfer speed of 480 megabits (Mb) per second or greater.

In certain embodiments, the high speed data has a transfer speed in the range of 480 Mb per second to 8 Gb per second.

In certain embodiments, the high speed data has a transfer speed in the range of 480 Mb per second to 6 Gb per second.

In certain embodiments, the high speed data has a transfer speed in the range of 6 Gb per second to 8 Gb per second.

In certain embodiments, the fourth set of one or more electrical contacts are contact pins.

In certain embodiments, the contact pins are selected from the group consisting of pogo pins, telescoping pins, spring biased pins, and conductive spring-loaded buttons.

In certain embodiments, the fourth set of one or more electrical contacts is electrically coupled to one or more twisted pairs of conductors.

In certain embodiments, the fourth set of one or more electrical contacts is hardwired to a circuit substrate.

In certain embodiments, the circuit substrate includes a plurality of conductive traces that are of equal length and equal width.

A hot shoe interface system for transmitting high speed data includes a hot shoe portion and a hot shoe receiving portion. The hot shoe portion includes a first set of one or more contact points and the hot shoe receiving portion includes a second set of one or more contact points. The second set of one more contact points is configured to operatively communicate with the first set to transmit power and data.

In certain embodiments, the hot shoe receiving portion is disposed on a mounting unit and the hot shoe receiving portion is disposed on a helmet.

In certain embodiments, the first set of contact points are contact pads.

In certain embodiment, the first set of contact points includes one or more of the following: optical interface terminals, high speed contact pads, low speed contact pads, high speed drain pad, coaxial contacts, radio frequency contacts, power ground pads, power drains, power pads, or shield pad.

In certain embodiments, the contact pads are gold plated brass.

In certain embodiments, the contact pads are gold plated copper.

In certain embodiments, each contact pad is electrically coupled to a conductor of a twisted pair of conductors.

In certain embodiments, two contact pads are disposed in a pair arrangement that facilitates desired impedance of data transmittal.

In certain embodiments, each contact pad is hardwired to a circuit substrate.

In certain embodiments, the conductor traces are of equal length and equal width.

In certain embodiments, the hot shoe portion has a substantially planar surface.

In certain embodiments, the hot shoe portion further comprises a front lip having a first inclined surface and a rear lip having a second inclined surface.

In certain embodiments, the hot shoe interface system is configured to transmit data at high speeds.

In certain embodiments, the hot shoe interface system is configured to communicate data at 6 gigabits (Gb) per second.

In certain embodiments, the second set of contact points are contact pins.

In certain embodiments, wherein the contact pins are selected from the group consisting of pogo pins, telescoping pins, spring biased pins, and conductive spring-loaded buttons.

In certain embodiments, the second set of contact points includes one or more of the following: optical interface terminals, high speed contact pins, low speed contact pins, high speed drain pin, coaxial contacts, radio frequency contacts, power ground pads, power drains, power pins, or shield pin.

In certain embodiments, the contact pins are gold plated brass.

In certain embodiments, the contact pins are gold plated copper.

In certain embodiments, wherein each contact pin is electrically coupled to conductor of a twisted pair of conductors.

In certain embodiments, the conductor traces are of equal length and equal width.

In certain embodiments, two contact pins are disposed in a pair arrangement that facilitates desired impedance of data transmittal.

In certain embodiments, the hot shoe receiver portion comprises a front catch portion configured to removably engage with the front lip and a rear catch portion configured to removably engage with the rear lip.

In certain embodiments, the radio frequency contact is a coaxial conductor pair.

In certain embodiments, the hot shoe interface is configured to transmit data from the accessory device.

In certain embodiments, the hot shoe receiving portion is disposed on a helmet.

In certain embodiments, the hot shoe receiving portion is disposed on a mounting unit.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Referring now to the drawings, FIGS. 1-4 illustrate a hot shoe interface configured to serve as a communication port with a helmet mount assembly and/or other external accessory device. The hot shoe, generally designated 100, includes a set of contact pads configured to communicate with a set of corresponding contact pins on a mounting assembly generally designated 200. The hot shoe 100 is advantageously disposed on an electrically operated device (not shown) or mounting unit therefor and serves as a mechanical and electrical attachment point.

Figure 1:
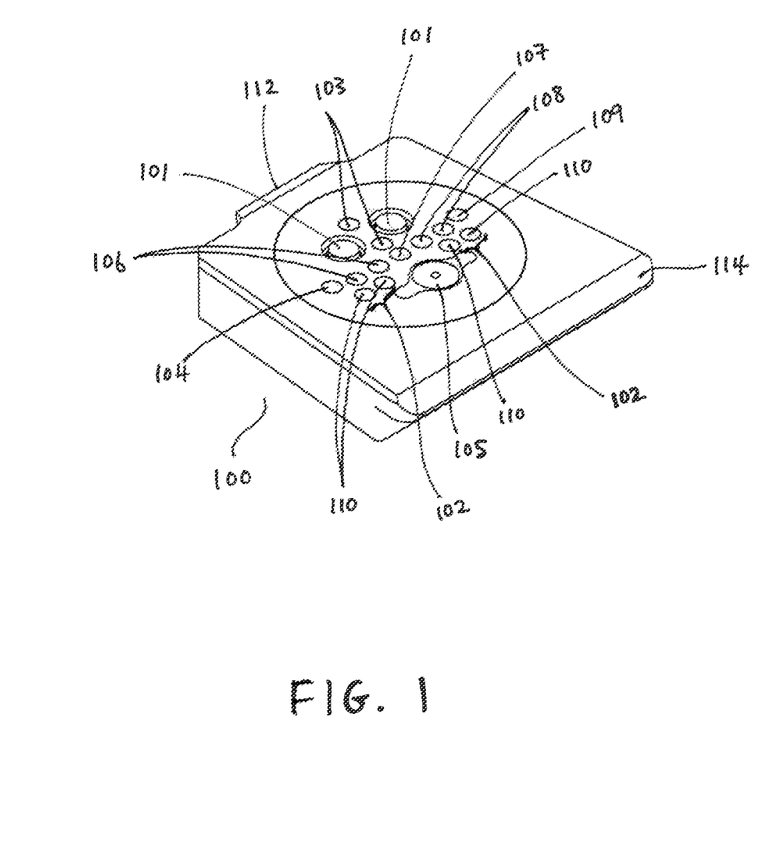
FIG. 1 is an isometric view of a hot shoe according to an exemplary embodiment.

Referring now to FIG. 1, the contact pads or terminals on the hot shoe 100 include one or more of the following: optical interface terminals 101, high speed data contact pairs 102 each comprising two pads 110, low speed data contact pads 103, high speed drain pad 104, coaxial or radio frequency (RF) contacts 105, power ground pads 106, power drains 107, power pads 108, and shield pad 109. The hot shoe 100 further allows redundant power, ground, and/or control or data signals to pass through the interface. In certain preferred embodiments, the data contact pads are gold plated, e.g., gold plated brass or copper, to minimize corrosion. Each high speed data contact pad 110 is electrically coupled to a respective conductor of a twisted pair of conductors.

Each pair of adjacent contacts 110 defines a pair of data contact pads 102. The data contact pads 110 defining each pair 102 are preferentially arranged/spaced apart to facilitate transmittal of data with the proper level of impedance. Each pad may be hardwired, e.g., soldered directly to a cable or may be connected to a circuit board or other circuit substrate. In certain embodiments where the pads are soldered to a circuit board or substrate, such as a printed circuit board, the circuit board traces of the conductive pair should be of equal lengths and widths in order to control impedance.

In certain embodiments, the radio frequency contact 105 is a coaxial conductor pair, e.g., an RF type connector for transmitting an RF video signal (e.g., composite video) across the hot shoe interface.

In certain embodiments, the hot shoe 100 has a generally planar surface 113, without plugs or receptacles. In certain embodiments, the hot shoe 100 includes a front lip 114 which may include a ramped or inclined surface to facilitate connection with the mounting assembly 200. The hot shoe 100 further includes a rear lip 112 which may include a ramped or inclined surface to facilitate connection with the mounting assembly 200.

In certain embodiments, the speed of the high speed data transmitted via the high speed data contact pads 110 is greater than 480 Mb per second. In certain embodiments, the speed of the high speed data transmitted via the high speed data contact pads 110 is between 480 Mb per second and 8 Gb per second. In certain embodiments, the speed of the high speed data transmitted via the high speed data contact pads 110 is between 480 Mb per second and 6 Gb per second. In certain embodiments, the speed of the high speed data transmitted via the high speed data contact pads 110 is between 6 Gb per second and 8 Gb per second. In reducing the present invention to practice, certain embodiments have been tested and proven to operate at data transfer speeds of 6 gigabits per second with Zero Bit Errors. In certain embodiments, the hot shoe interface is further capable of transmitting video data and augmented reality data sent from an accessory device, such as a viewing device. In certain embodiments, the speed of the low speed data transmitted via the low speed data contact pads 103 is on the order of kilobits per second.

Figure 2:
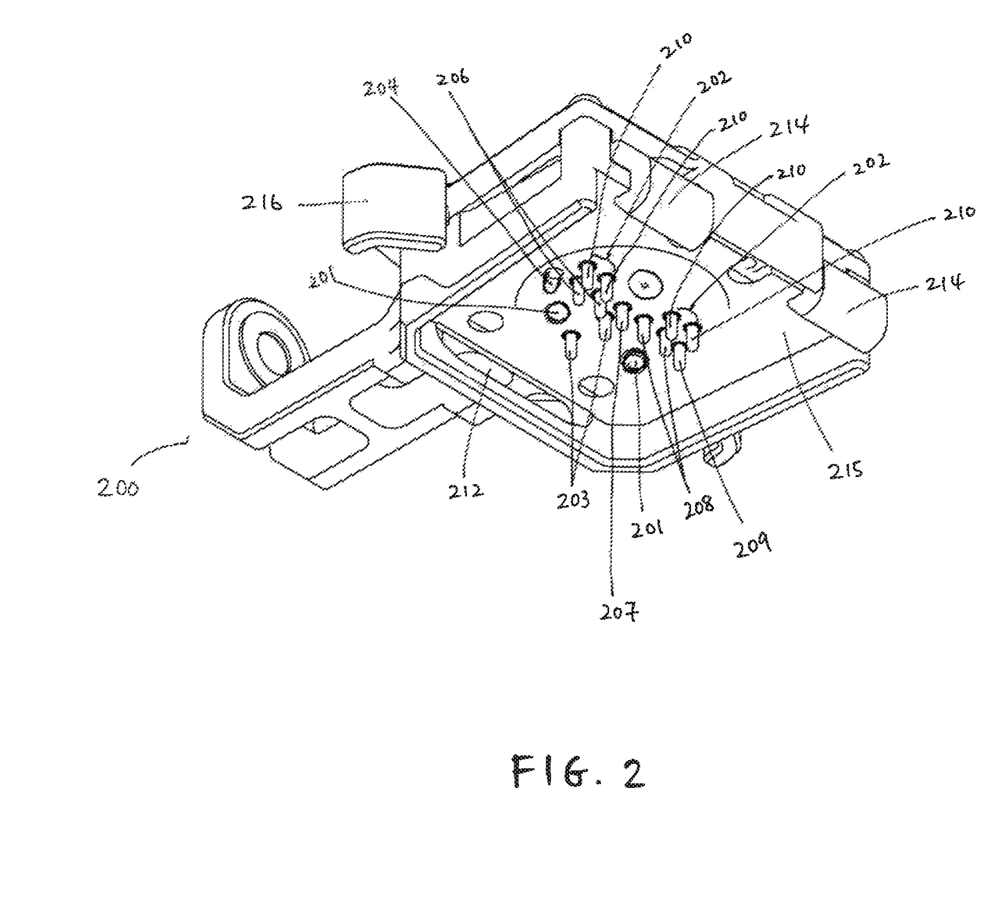
FIG. 2 is an isometric view, taken generally from the bottom, of a mounting assembly configured to interface with the hot shoe of FIG. 1.
Figure 3:
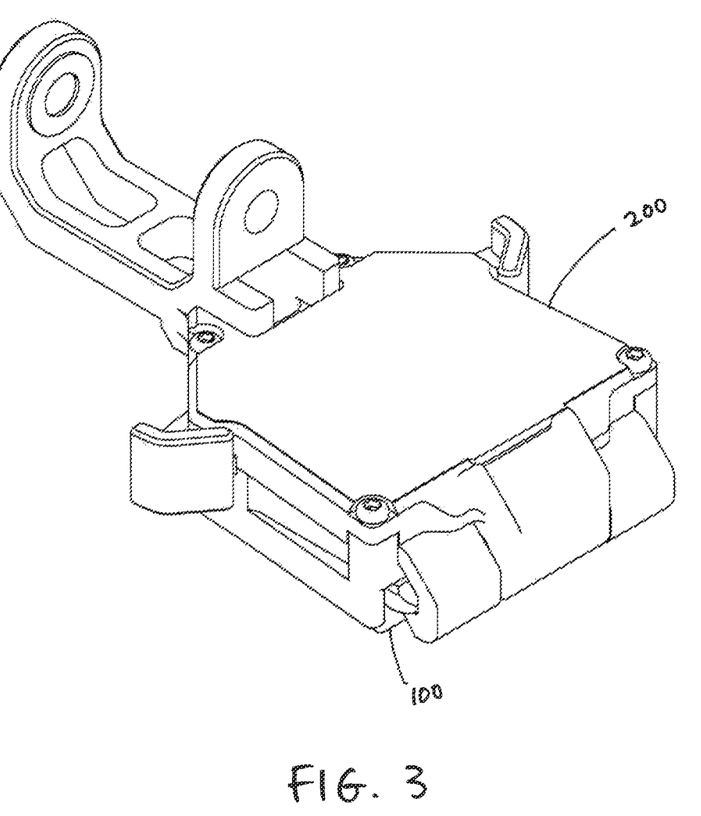
FIG. 3 is an isometric view, taken generally from the top, of the mounting assembly of FIG. 2 engaged with the hot shoe of FIG. 1.
Figure 4:
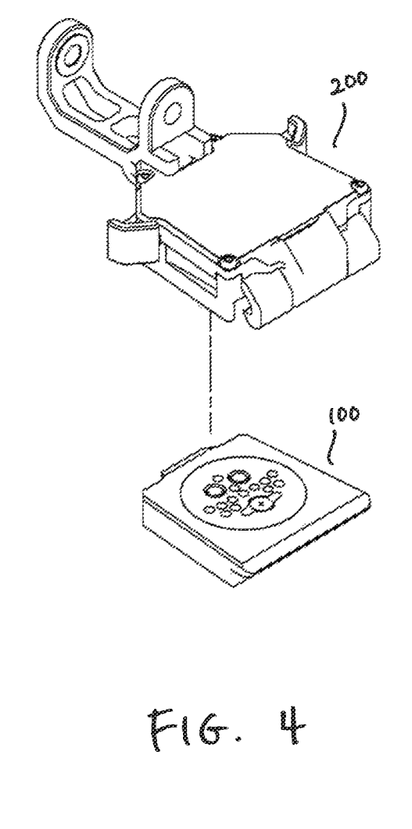
FIG. 4 is a partially exploded view of the mounting assembly of FIG. 2 in relation to the hot shoe of FIG. 1.

Referring now to FIGS. 2 and 3, the mount assembly 200 includes a hot shoe receiver 215. In certain embodiments, the hot shoe receiver 215 includes a resilient fastener element for removable attachment of the mounting assembly 200, e.g., of an accessory device, battery pack, etc. to a hot shoe 100, e.g., via a snap fit engagement with the edges of the hot shoe 100. It is recognized that other means of attachment are contemplated, e.g., wherein the hot shoe 100 slides into a hot shoe receiver 215 and is held in place by a lock or clamp mechanism. Activation of a release mechanism allows the hot shoe 100 to be released and for removal of the mounting assembly or other device).

As illustrated in FIG. 2, the hot shoe receiver 215 includes a number of contact pins for coupling with the hot shoe 100 contact pads. In certain embodiments, the contact pins are pogo pins (i.e., telescoping, spring biased pins), conductive spring-loaded buttons, or other suitable physical connection transmitting feature. The illustrated hot shoe receptacle 215 includes one or more of the following contact points: high speed contact pins 210, low speed contact pins 203, RF contact points 205, grounding pins 206, power drains 207, power pins 208, and shield pin 209. Each high speed contact pin 210 is coupled to a respective conductor of a twisted pair cable.

Each set of adjacent pins 210 comprises a pair of contact pins 202. In certain embodiments, high speed contact pins 210 are gold plated brass or copper pins. When the hot shoe receptacle 215 is attached to the hot shoe 100, the contact pins on the hot shoe receptacle 215 are in operable connection with a respective aligned one of the contact pads on the hot shoe 100, such that data and power may be transmitted through the hot shoe interface.

In certain embodiments, the mount assembly 200 includes one or more front catch mechanisms 214, to removably engage the front lip 114 of the hot shoe 100. The mount assembly 200 further includes an opening 212 for removably engaging the rear lip 112 of the hot shoe 100. In certain embodiments, the mount assembly 200 includes a release lever 216 for disconnection of the mount assembly 200 from the hot shoe 100. The release lever 216 is operably connected to the catches 214 such that engagement of the release lever 216 disengages the catches 214 from the front lip 114.

In certain embodiments, wherein the hot shoe interface is employed in connection with a helmet mount assembly, e.g., for positioning a viewing device in front of the eyes of a user, and may be operable when an attached accessory device, such as a night vision device or other viewing device, is in an active position and powered off when the mounted accessory device is moved to a stowed or inactive position when not in use. In certain embodiments, the accessory device, for example, a viewing device, includes a magnetic sensing device, such as a reed switch, Hall effect sensor, magnetometer or the like, for sensing when the mount assembly 200 is in an operative position, e.g., an active viewing position versus stowed position. When the mounting assembly is in an active position, the accessory device is powered on and able to receive or transmit data, including video or augmented reality data, via the hot shoe interface. Other means of activating or deactivating the accessory device are contemplated, such as manual buttons or switches.

The hot shoe interface may be used with, for example, a helmet system. In certain embodiments, a helmet system with three hot shoe interfaces is contemplated, whereby the first hot shoe 100 is mounted to a rear portion of the helmet and is configured to connect to an outside battery pack and the second hot shoe 100 is mounted to a front portion of the helmet and is configured to connect to a first end of a mounting assembly 200. The second end of the mounting assembly 200 further includes a third hot shoe 100, configured to connect to an accessory device. The accessory device may be a night vision goggle, camera, and/or other near-eye display and so forth. The accessory device may alternatively be a helmet mounted display screen, heads-up display or any other helmet mounted optical, electro-optical or other viewing or tactical device that may be mounted to the mount assembly 200 or configured to mount directly or indirectly to the helmet. In certain embodiments, the mount assembly 200 is adjustable. It will be recognized that the present development is not limited to use with helmets.

Figure 5:
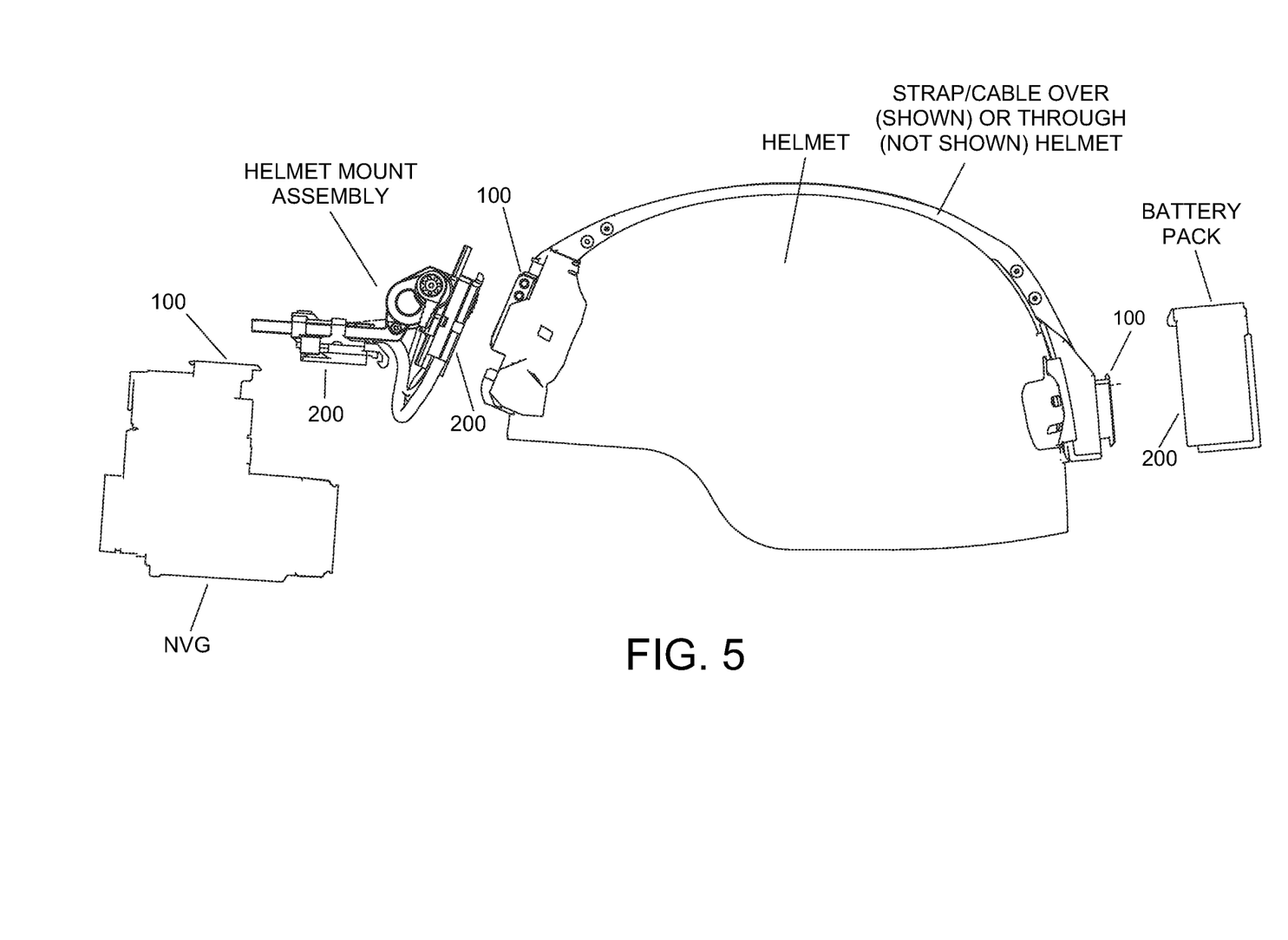
FIG. 5 is a partially exploded view of a helmet mount system with a helmet strap system employing the hot shoe interface of FIG. 3.

In certain embodiments, the helmet includes one or more conductive pathways to provide power, control and/or data signals between a power source, such as the outside battery pack, and the helmet mount accessory 200 and/or accessory device. In certain embodiments, an outside computer processor, such as a computer processor on a weapon, may be configured to communicate wirelessly with the battery pack and/or accessory device and control the same. An exemplary system including a battery pack, helmet mount, and viewing accessory is illustrated in FIG. 5. It will be recognized that any one or more of the attached shoe 100/receptacle 200 pairs as shown in FIG. 5 may be reversed from the arrangement depicted in FIG. 5.

All numbers herein are assumed to be modified by the term "about," unless stated otherwise. The recitation of numerical ranges by endpoints includes all numbers subsumed within that range (e.g., 1 to 5 includes 1, 1.5, 2, 2.75, 3, 3.80, 4, and 5).

The invention has been described with reference to the preferred embodiment. Modifications and alterations will occur to others upon a reading and understanding of the preceding detailed description. It is intended that the invention be construed as including all such modifications and alterations.

What is claimed is:

1. A hot shoe interface system for transmitting high speed data, comprising:
   a hot shoe portion comprising:
      a first set of one or more electrical contacts configured to receive high speed data from a first device attached to the hot shoe portion;
      a second set of one or more electrical contacts configured to receive a power signal;
      a third set of one or more electrical contacts configured to receive low speed data from the first device; and
      a first set of optical terminals configured to receive optical data from the first device;
   a hot shoe receiver comprising:
      a fourth set of one or more electrical contacts configured to provide the high speed data to a second device attached to the hot shoe receiver;
      a fifth set of one or more electrical contacts configured to receive the power signal;
      a sixth set of one or more electrical contacts configured to provide the high speed data to the second device; and
      a second set of optical terminals configured to transmit optical data to the second device.

2. The hot shoe interface system of claim 1, wherein the hot shoe portion is disposed on a helmet.

3. The hot shoe interface system of claim 1, wherein the hot shoe receiving portion is disposed on a helmet mount assembly.

4. The hot shoe interface system of claim 1, wherein the first set of one or more electrical contacts are contact pads.

5. The hot shoe interface system of claim 1, wherein the hot shoe portion further comprises a seventh set of one or more electrical contacts configured to receive a radio frequency signal for the first device.

6. The hot shoe interface system of claim 5, wherein the radio frequency signal is an analog or digital video signal.

7. The hot shoe interface system of claim 5, wherein the hot shoe receiving portion further comprises an eighth set of one or more electrical contacts configured to transmit the radio frequency signal to the second device.

8. The hot shoe interface system of claim 1, wherein the first set of one or more electrical contacts is electrically coupled to one or more twisted pairs of conductors.

9. The hot shoe interface system of claim 1, wherein the first set of one or more electrical contacts are disposed in a pair arrangement that facilitates a desired data transfer impedance.

10. The hot shoe interface system of claim 1, wherein the first set of one or more electrical contacts are hardwired to a circuit substrate.

11. The hot shoe interface system of claim 10, wherein the circuit substrate includes a plurality of conductive traces that are of equal length and equal width.

12. The hot shoe interface system of claim 1, wherein the hot shoe portion has a substantially planar surface.

13. The hot shoe interface system of claim 12, wherein the hot shoe portion further comprises a front lip having a first inclined surface and a rear lip having a second inclined surface.

14. The hot shoe interface system of claim 13, wherein the hot shoe receiver portion comprises a front catch portion configured to removably engage with the front lip and a rear catch portion configured to removably engage with the rear lip.

15. The hot shoe interface system of claim 1, wherein the high speed data has a data transfer speed in the range of 480 Mb per second to 8 Gb per second.

16. The hot shoe interface system of claim 1, wherein the fourth set of one or more electrical contacts are contact pins.

17. The hot shoe interface system of claim 16, wherein the contact pins are selected from the group consisting of pogo pins, telescoping pins, spring biased pins, and conductive spring-loaded buttons.

18. The hot shoe interface system of claim 1, wherein the fourth set of one or more electrical contacts is electrically coupled to one or more twisted pairs of conductors.

19. The hot shoe interface system of claim 18, wherein the fourth set of one or more electrical contacts is hardwired to a circuit substrate.

20. The hot shoe interface system of claim 14, wherein the circuit substrate includes a plurality of conductive traces that are of equal length and equal width.

* * * * *